United States Patent [19]

Goumaz

[11] Patent Number: 5,467,056
[45] Date of Patent: Nov. 14, 1995

[54] VERY HIGH SPEED PRECISION AMPLIFIER

[75] Inventor: Jean-François Goumaz, Meyrin, Switzerland

[73] Assignee: LeCroy S.A., Meyrin, Switzerland

[21] Appl. No.: 224,883

[22] Filed: Apr. 8, 1994

[30] Foreign Application Priority Data

Apr. 8, 1993 [EP] European Pat. Off. ............. 93105837

[51] Int. Cl.$^6$ ........................................ H03F 1/30
[52] U.S. Cl. .............................. 330/149; 330/107
[58] Field of Search ................................ 330/107, 136, 330/149, 260, 289, 109

[56] References Cited

U.S. PATENT DOCUMENTS

| | | |
|---|---|---|
| 3,825,854 | 7/1974 | Pichal ................................ 330/149 |
| 4,276,514 | 6/1981 | Huang ................................ 330/149 |
| 4,491,802 | 1/1985 | Uchida et al. ..................... 330/260 |

FOREIGN PATENT DOCUMENTS 1494208 7/1989 U.S.S.R. .......................... 330/136

OTHER PUBLICATIONS

K. I. Zapodovnikov, Instruments and Experimental Techniques, Sep. 1986, pp. 1108–1110, vol. 29, No. 5, Part 1, New York, N.Y., USA.

*Primary Examiner*—Steven Mottola
*Attorney, Agent, or Firm*—Oblon, Spivak, McClelland, Maier & Neustadt

[57] ABSTRACT

The high speed precision composite amplifier includes a compensation network (7) which corrects the low frequencey distortions of the high speed amplifier F (2).

6 Claims, 2 Drawing Sheets

5,467,056

VERY HIGH SPEED PRECISION AMPLIFIER

TITLE OF THE INVENTION

BACKGROUND OF THE INVENTION

1. Field of the Invention

This invention concerns a very high speed precision composite amplifier for use in, among others, oscilloscope signal conditioning, where the open-loop high-speed precision amplifier can be a degenerated long tail pair amplifier.

DISCUSSION OF THE BACKGROUND

Very high speed amplifiers (1–2 GHz frequency range) often use open loop or local feedback architecture and the active devices used require a high frequency gain ($f_T$=10–12 GHz). These devices are of very small geometries in order to reduce the high frequency parasitic components. The unfortunate consequence of small geometries is that the thermal resistance (junction to case) increases which means that self heating effects (signal induced temperature changes) can create thermal distortions in the response of the amplifier.

The amplitude of the thermal distortion for a very high speed open loop or local feedback amplifier can be as high as 5% of the signal amplitude, a level which is unacceptable for a precision measuring instrument. The thermal distortions appear as medium and low frequency changes in the gain or/and the offset of the very high speed amplifier. These effects occur well in the frequency band of modern operational or transimpedance amplifiers. In addition, different types of thermal drifts (as a result of ambient temperature changes) will degrade the precision of such very high speed amplifiers.

It is known in the art to implement various compensation networks with a fast amplifier. For example, in U.S. Pat. No. 4,132,958, a feed-beside network is proposed comprising several adjustable filters to compensate the thermal distortions of the amplifier. The problem is that it requires many critical adjustments of the correcting filters, and that a chosen specific compensation cannot take care of global temperature drifts. Another common practice is to AC-couple the fast amplifier and to add a DC-closed loop amplifier on its side (split path amplifiers). The high frequency components of the signal pass through the AC-coupled HF amplifier, while the low frequency and DC components pass through the DC amplifier. The problems here are to ensure a good match of the dominant pole of the DC amplifier with the low frequency cutoff of the high frequency amplifier. This adjustment can be difficult and is subject to drift with temperature, which results in loss of frequency response flatness.

In U.S. Pat. No. 4,491,802, another solution is proposed in which the input and output of a first amplifier are fed back to a second amplifier through low-pass filters, where the output of that second amplifier is fed back negatively to the first amplifier. The main drawback of this implementation is that the desired flatness of the overall transfer function is limited to low frequencies.

SUMMARY OF THE INVENTION

In view of the shortcomings of this latter state of the art for high frequency applications, the goal of the present invention is to propose a high speed precision composite amplifier in which the composite gain becomes independent of the frequency and in particular of the low frequency behavior of the high speed amplifier F, by choosing the characteristics of the input and output transfer networks I and O (FIG. 1) in such a way that the low frequency gain is identical to the high frequency gain of the amplifier F.

In further preferred embodiments, the input and output transfer networks are resistive networks with either a constant or a specifically selected temperature behaviour. The latter is chosen to compensate the temperature dependence of the transconductance of the amplifier F.

In further preferred embodiments, the composite amplifier additionally comprises an input protection network, and the precision amplifier P comprises an output limiter, to prevent the composite amplifier from going into saturation.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
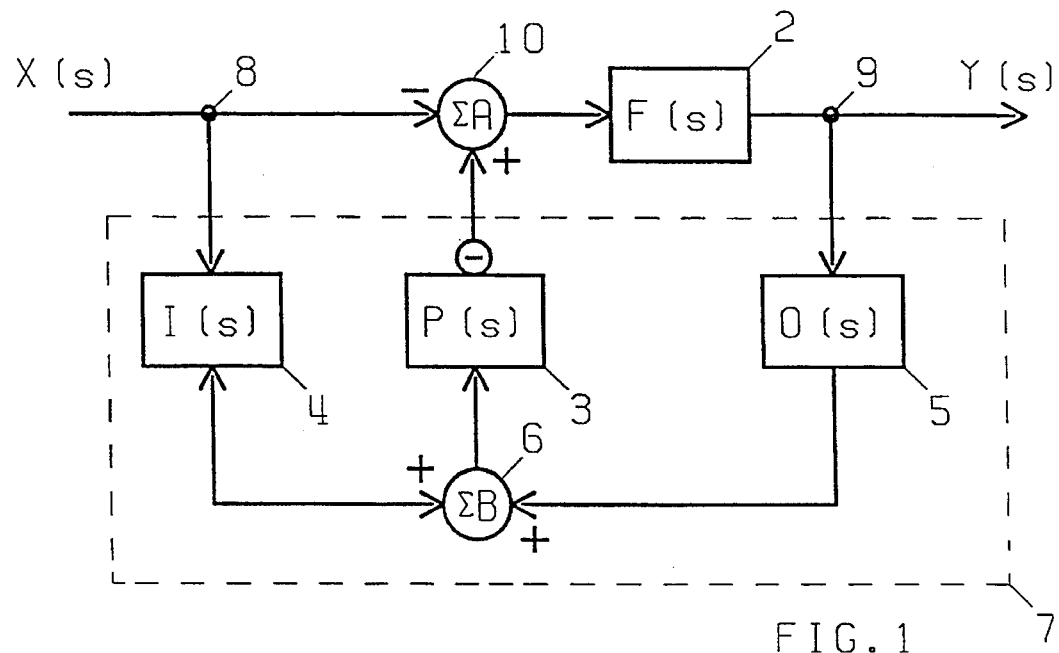
FIG. 1 is a block diagram of the inventive composite amplifier

Referring now to the block diagram of FIG. 1,

F(s) is the transfer function of the fast amplifier F (2),

ΣA is the summing node (10) of the fast amplifier F (2),

P(s) is the transfer function of the precision amplifier P (3),

ΣB is the summing node (6) of the precision amplifier P (3),

I(s) is the transfer function of the input network I (4),

O(s) is the transfer function of the output network O (5).

It is straightforward to establish that the global transfer function of the present composite amplifier is therefore given by equation 1):

$$\frac{Y(s)}{X(s)} = -F(s) \cdot \frac{1 + I(s) \cdot P(s)}{1 + F(s) \cdot O(s)} \cdot P(s) \qquad 1)$$

A quick study shows that, under appropriate conditions, the non flatness of the response of the high speed amplifier F (2), which is assumed to be located in the low frequency domain only, is corrected by the action of the precision amplifier P (3), and that the composite amplifier will have the HF response of the high speed amplifier F (2).

Figure 2:
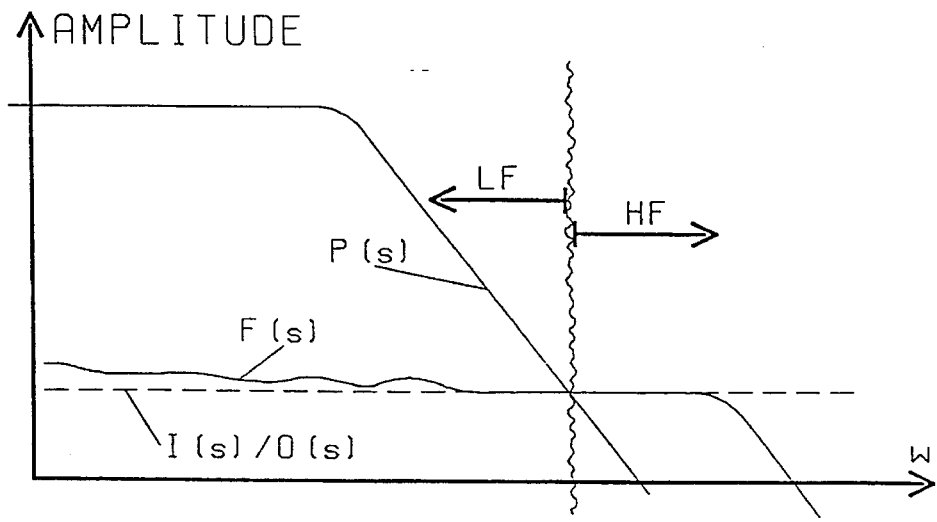
FIG. 2 gives the gain-frequency relationships of some of the relevant transfer functions.

Referring to FIG. 2, in the low frequency domain, the open loop gain of the precision amplifier P (3) is selected to be much larger (>10x) than the open loop gain of the high speed amplifier F (2) and the frequency responses I(s) and O(s) of the input and output networks I (4) and O (5) can be assumed to be perfectly flat.

The analysis of equation 1) gives the following results:

a) in the low frequency domain: if it is stipulated that 2)

|I(s)·P(s)| >> 1 and 3) |F(s)·O(s)·P(s)| >> 1, then equation 1) becomes $$\frac{Y(s)}{X(s)} = -\frac{I(s)}{O(s)} \quad 4)$$

which is defined to be flat and independent of F(s).

b) in the high frequency domain: if one adjusts I(s) and O(s) so that: 5) I(s)=F(s)·O(s), then equation 1) becomes $$\frac{Y(s)}{X(s)} = -F(s) \quad 6)$$

Since with the choice made in 5), equation 4) and 6) are the same, the final result is that for the composite amplifier, one obtains a constant gain over the whole frequency domain. In other words, one obtains the flatness of a precision closed loop amplifier and the very high bandwidth of a very fast open loop bipolar amplifier.

Figure 3:
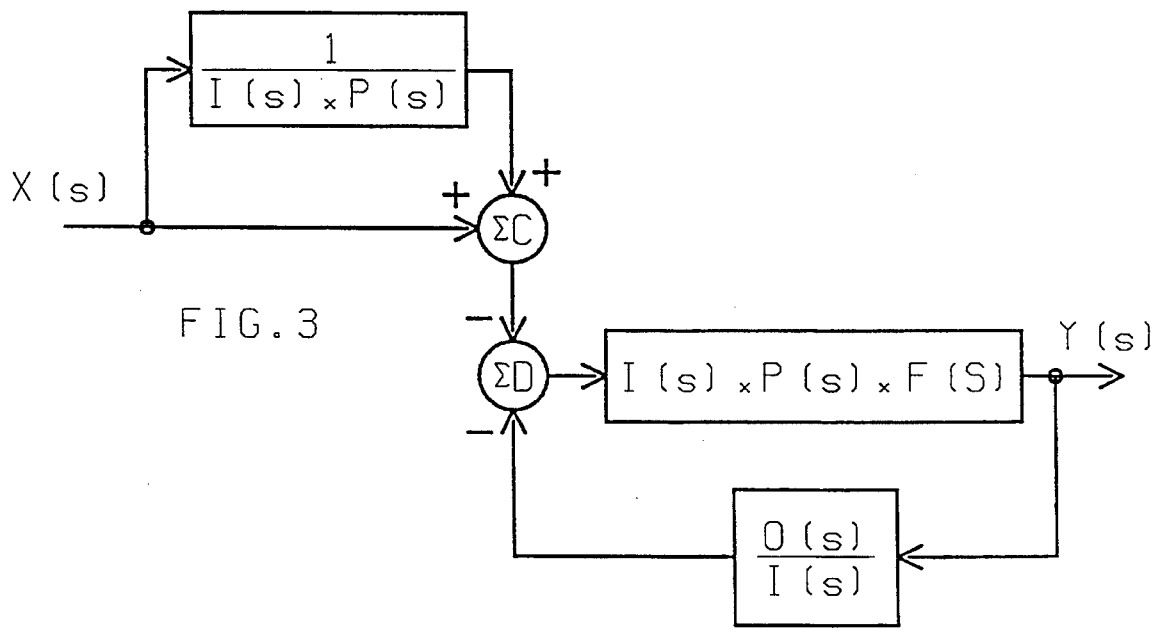
FIG. 3 shows a standard feedback block diagram, equivalent to the one in FIG. 1.
Figure 4:
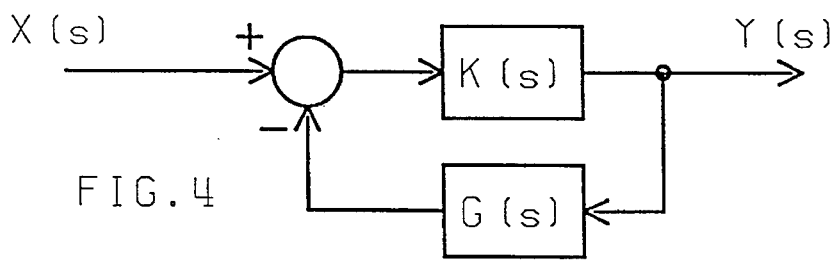
FIG. 4 gives the canonical feedback block diagram.

If a stability analysis were to be made, one could use the block diagram of FIG. 3 which is derived from and equivalent to FIG. 1. In FIG. 3, the right hand part, including the ΣD summing node, has the form of a canonical feedback control system (FIG. 4), with I(s).P(s).F(s) representing the forward path transfer function and O(s)/I(s) representing the feedback path transfer function. In FIG. 3 the left hand part, including summing node ΣC represents a filter comprising a zero in its transfer function whose effect it is to reduce the overall transfer function to be identical to F(s) in the high frequency domain.

Figure 5:
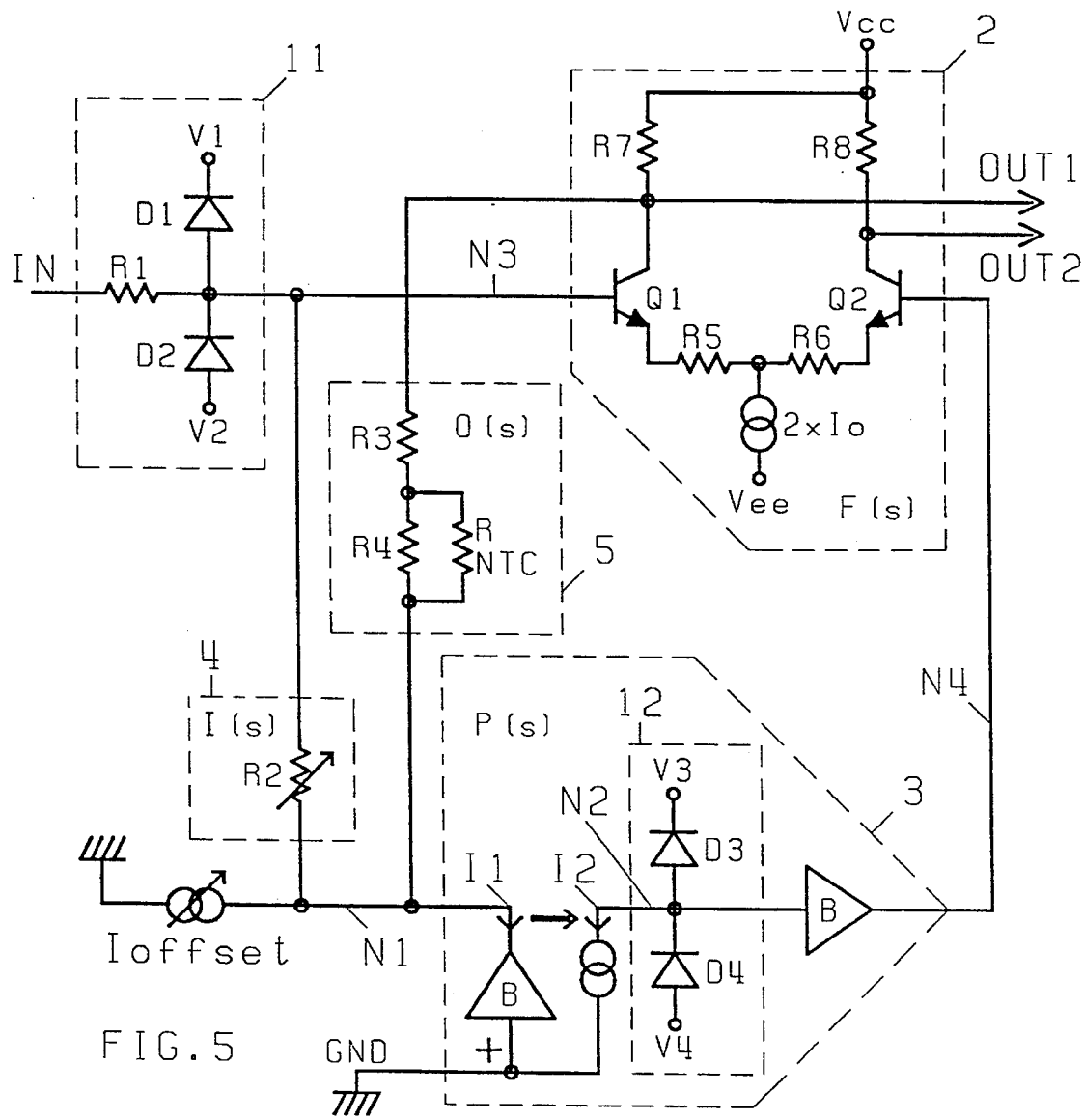
FIG. 5 is a schematic diagram of a preferred embodiment of the invention.

A preferred embodiment of the invention is represented in FIG. 5.

Resistor $R_1$ and diodes $D_1$, $D_2$, represent an input protection network 11 which has the advantage of limiting the amount of overdrive that can be applied to the active input of the amplifier F (2). V1, V2 are the upper and lower input voltage limits, respectively. Resistor $R_2$ represents the simplest embodiment of I(s); by adjusting the value of $R_2$ the low frequency gain of the composite amplifier can be adjusted to be equal to the gain of F(s) to obtain the overall flatness of the composite amplifier.

The resistor network 5 composed of $R_3$, $R_4$, and $R_{NTC}$, represents a simple embodiment of O(s); the presence of a negative temperature resistance, $R_{NTC}$, is required to compensate to first order the transconductance temperature drift of F(s) when the F(s) embodiment is a degenerated long tail pair amplifier as here. $I_{offset}$ is a controlled current which serves as offset control of the composite amplifier.

Node N1 is the embodiment of the summing node ΣB 6 in FIG. 1. It is a low impedance current summing node which sums the current outputs of I(s) and O(s) plus the additional offset control current $I_{offset}$; the voltage of N1 is maintained close to ground so that it can be considered to be a virtual ground.

The subcircuit 3 is an embodiment of the precision amplifier P. It takes the form of a transimpedance amplifier with access to its Z-node, N2, where the network 12 comprising the two diodes $D_3$ and $D_4$ tied to the voltage levels $V_3$ and $V_4$ serves to limit the output swing of the transimpedance amplifier. In some commercial transimpedance amplifiers these limiting elements can be part of the amplifier.

The main advantage of using the above described embodiment of P (3) is that the overload recovery of the amplifier is extremely fast, due to the fact that no part of the whole amplifier goes into saturation when the input level exceeds the normal operational range.

The subcircuit 2 is an embodiment of the fast amplifier F, the summing node ΣA 8 of the FIG. 1 embodiment is constituted by the base nodes N3, N4 of the transistors Q1, Q2. The network 2 comprising Q1, Q2, the resistors $R_5$, $R_6$, and the current source 2.$I_o$ is known as degenerated long tail pair amplifier or degenerated differential pair amplifier or $g_m$ cell. The single ended transconductance $g_{mse}$ of the amplifier is known to be in first order approximation $$g_{mse} = 0.5 \times \left( R_E + \frac{k \cdot T}{q \cdot I_o} \right)^{-1} \quad 7)$$

where $R_E$ is equal to $R_5$ as well as $R_6$, k is the Boltzmann constant, T represents absolute temperature, q an electron charge, and $I_o$ the half tail current.

When taking the derivate of the above expression with respect to T, one obtains the first order temperature dependence of the gain of the fast amplifier F 2 in the present embodiment which has to be compensated by the output network O, including $R_{NTC}$, the negative temperature coefficient resistor.

$R_7$ and $R_8$ are output load resistors transforming the current outputs of the $g_m$ cell into output voltages.

It is to be noticed that this particular embodiment of the fast amplifier has the additional benefit of having two distinct complementary outputs, which can be used to drive two independent circuits like an analog to digital converter and the trigger circuit of a digital oscilloscope.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A high speed, precision composite amplifier comprising:

an input terminal to which an input signal is applied;

an output terminal to which an output signal is applied;

an open-loop high-speed precision amplifier connected to said output terminal;

a compensation network for compensating distortions of said open-loop high speed precision amplifier, said compensation network comprising:

(1) an input transfer network which receives said input signal from said input terminal, said input transfer network being a resistive network;

(2) an output transfer network which receives said output signal from said output terminal, said output transfer network being a resistive network;

(3) a first summing node which receives and sums outputs of said input transfer network and said output transfer network; and (4) a high precision, high speed amplifier which receives an output of said first summing node; and a second summing node which receives and sums an output of said high precision, high speed amplifier with said input signal and outputs the sum to said open-loop, high speed, precision amplifier, wherein transfer functions of said open-loop, high speed amplifier F(s), said high precision, high speed amplifier P(s), said input transfer network I(s), and said output transfer network O(s) satisfy the following conditions:

|I(s)·P(s)| >> 1

$|F(s) \cdot O(s) \cdot P(s)| \gg 1$ at low frequencies, and $I(s)=F(s) \cdot O(s)$ at high frequencies.

2. A composite amplifier according to claim 1, wherein said output transfer network has a temperature dependence which corrects a first-order temperature dependence of a gain of said open-loop, high speed amplifier.

3. A composite amplifier according to any one of claims 1 or 2, further comprising an input protection network which limits said input signal between first and second values.

4. A composite amplifier according to claim 3, wherein said open-loop, high speed amplifier is a degenerate long tail pair amplifier.

5. A composite amplifier according to claim 4, wherein said high precision, high-speed amplifier is a transimpedance amplifier.

6. A composite amplifier according to claim 5, wherein said high precision, high speed amplifier comprises an output limiter having first and second diodes tied to a Z-point of said transimpedance amplifier and, respectively, to different voltage levels.

* * * * *